United States Patent
Griffith et al.

(10) Patent No.: US 9,628,088 B2
(45) Date of Patent: Apr. 18, 2017

(54) MULTI-MODE CRYSTAL OSCILLATORS

(71) Applicant: Texas Instruments Incorporated, Dallas, TX (US)

(72) Inventors: Danielle Griffith, Richardson, TX (US); Viral Parikh, San Diego, CA (US); Ryan Smith, Sachse, TX (US); Per Torstein Roine, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 137 days.

(21) Appl. No.: 14/463,658

(22) Filed: Aug. 19, 2014

(65) Prior Publication Data

US 2015/0056934 A1    Feb. 26, 2015

Related U.S. Application Data

(60) Provisional application No. 61/867,681, filed on Aug. 20, 2013.

(51) Int. Cl.
*H04B 1/40* (2015.01)
*H03L 7/02* (2006.01)

(52) U.S. Cl.
CPC ...... *H03L 7/02* (2013.01); *H04B 1/40* (2013.01)

(58) Field of Classification Search
CPC .... H03L 7/02; H04B 1/40; H04B 1/54; H04B 1/50; H04B 1/005; H04B 1/26; H04B 1/44; H04B 1/30; H03B 5/36; H03B 5/362; H03B 5/364; H03B 2202/03; H03B 2202/084
USPC ...... 455/550.1, 84–87, 196.1, 208, 255–259; 331/108 D, 108 C, 116 R
See application file for complete search history.

(56) References Cited

U.S. PATENT DOCUMENTS

| | | | | |
|---|---|---|---|---|
| 5,905,412 A | * | 5/1999 | Rasmussen | H03K 3/011 327/288 |
| 7,228,118 B2 | * | 6/2007 | Stevenson | H03L 1/026 331/25 |
| 2004/0133912 A1 | * | 7/2004 | Thomas | H04L 12/10 725/80 |
| 2009/0088194 A1 | * | 4/2009 | Petty, Jr. | H04W 52/029 455/502 |
| 2012/0074998 A1 | * | 3/2012 | Brett | H03L 1/022 327/157 |

OTHER PUBLICATIONS

Griffith, Danielle et al., "A 65nm CMOS DCXO System for Generating 38.4MHz and a Real Time Clock from a Single Crystal in 0.09 mm," 2010 IEEE Radio Frequency Integrated Circuit Symposium, May 23-25, 2010, Anaheim, CA, US.

* cited by examiner

*Primary Examiner* — Nhan Le
(74) *Attorney, Agent, or Firm* — Ronald O. Neerings; Charles A. Brill; Frank D. Cimino

(57) ABSTRACT

Digital control of a crystal oscillator is implemented in a manner that allows frequency accuracy to be traded off dynamically with power consumption. The oscillator transitions between a less accurate/lower power mode and a high accuracy/higher power mode smoothly without requiring any external clock source during the transition. Power consumption is optimized because the crystal oscillator provides the clock source during transitions between the power modes and no other clock source is needed for these transitions. The system can also optimize the startup time and steady state power consumption independently.

15 Claims, 5 Drawing Sheets

MULTI-MODE CRYSTAL OSCILLATORS

CROSS-REFERENCE TO RELATED APPLICATIONS

The present application claims the benefit of the filing date of U.S. Provisional Patent Application No. 61/867,681, filed on Aug. 20, 2013, titled "System and Method for Enabling Low Power Multi-Mode Crystal Oscillators" the disclosure of which is hereby incorporated by reference herein in its entirety.

TECHNICAL FIELD

Embodiments of the invention are directed, in general, to crystal oscillators and, more specifically, to maintaining frequency accuracy in crystal oscillators that operate in different power modes.

BACKGROUND

Crystal oscillators typically use an analog control loop. This control loop is typically not sufficient to allow the oscillator to operate in both a high power mode with high frequency accuracy and a low power mode with less frequency accuracy. Existing solutions require an extra clock source to transition the oscillator between a low power/low accuracy mode and a high power/high accuracy mode.

SUMMARY

Embodiments of the invention implement digital control of a crystal oscillator to allow frequency accuracy to be traded off dynamically with power consumption while still maintaining a highly energy-efficient system. The oscillator may transition between a less accurate/lower power mode and a high accuracy/higher power mode smoothly without requiring any external clock source during the transition. Power consumption is optimized because the crystal oscillator provides the clock source during transitions between the power modes and no other clock source is needed for these transitions. The system can also optimize the startup time and steady state power consumption independently.

BRIEF DESCRIPTION OF THE DRAWINGS

Figure 1:
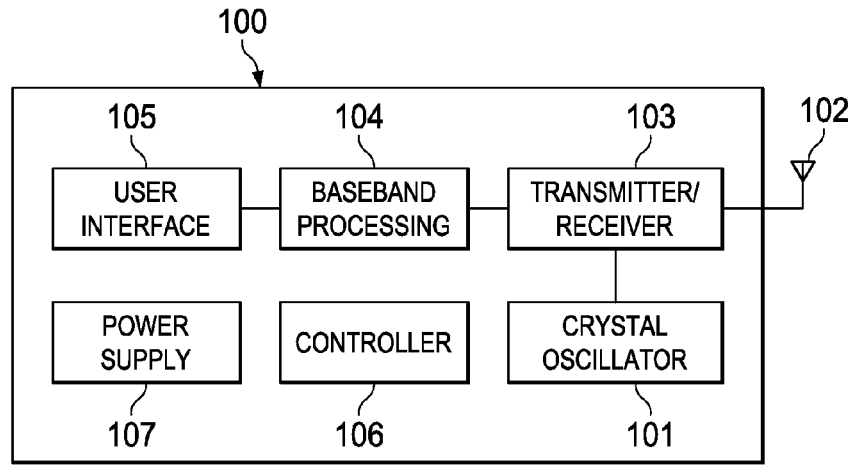

Having thus described the invention in general terms, reference will now be made to the accompanying drawings, wherein:

FIG. 1 is highly simplified block diagram of a wireless communication device that uses a crystal oscillator circuit.

Figure 2:
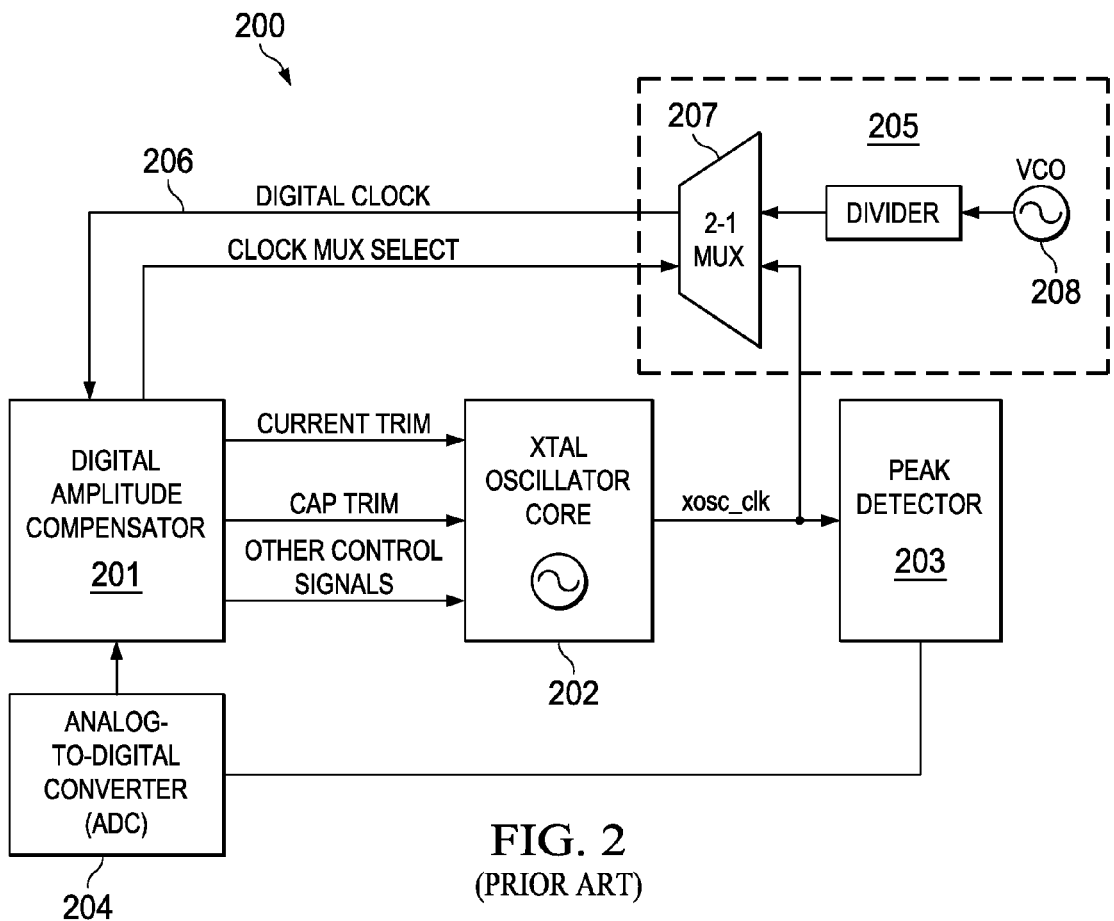

FIG. 2 is a block diagram illustrating a prior art crystal oscillator circuit.

Figure 3:
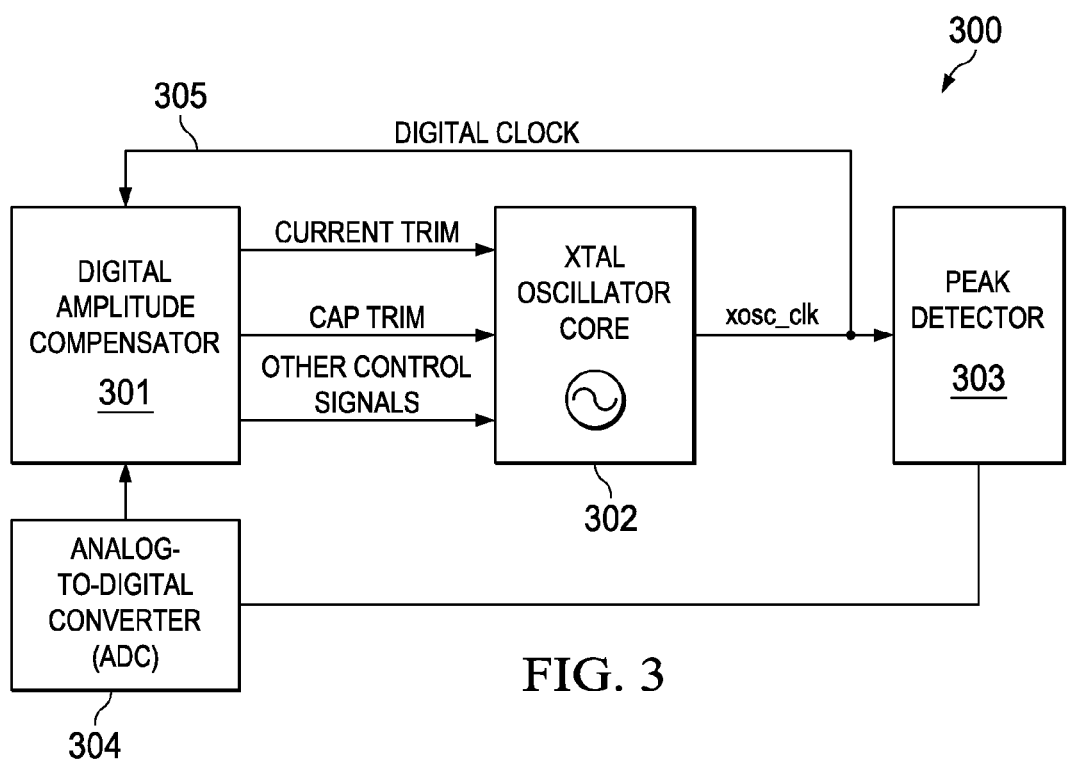

FIG. 3 is a block diagram illustrating crystal oscillator circuit that does not require an extra clock source to transition the oscillator between power modes.

Figure 4:
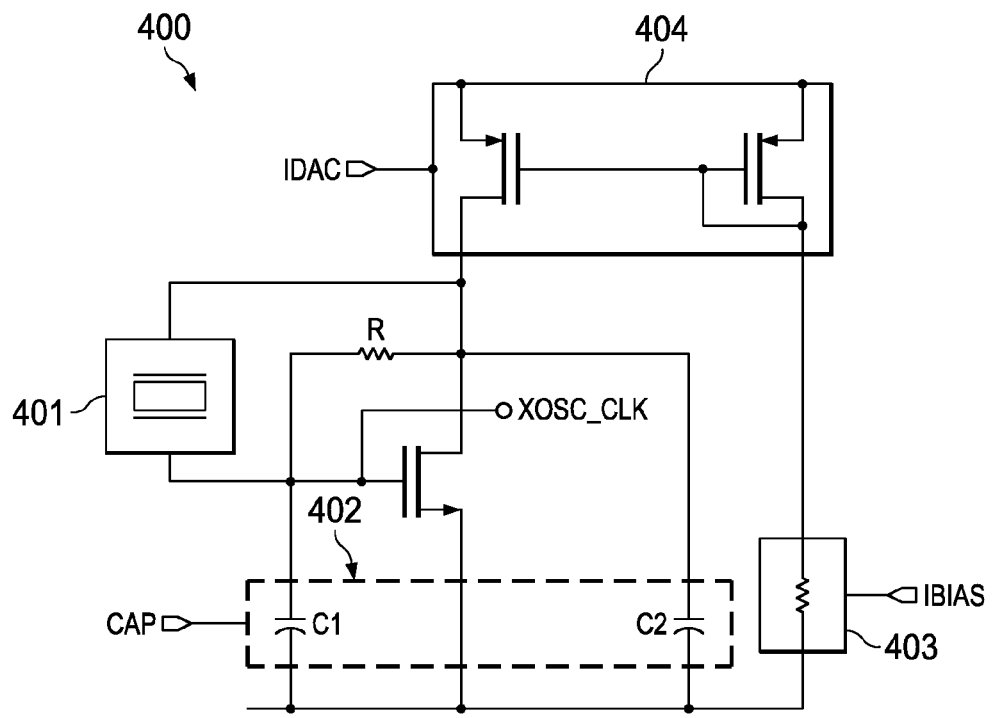

FIG. 4 is a schematic of an analog portion of an oscillator indicating the adjustments that may be used to transition between low power and high power modes.

Figure 5:
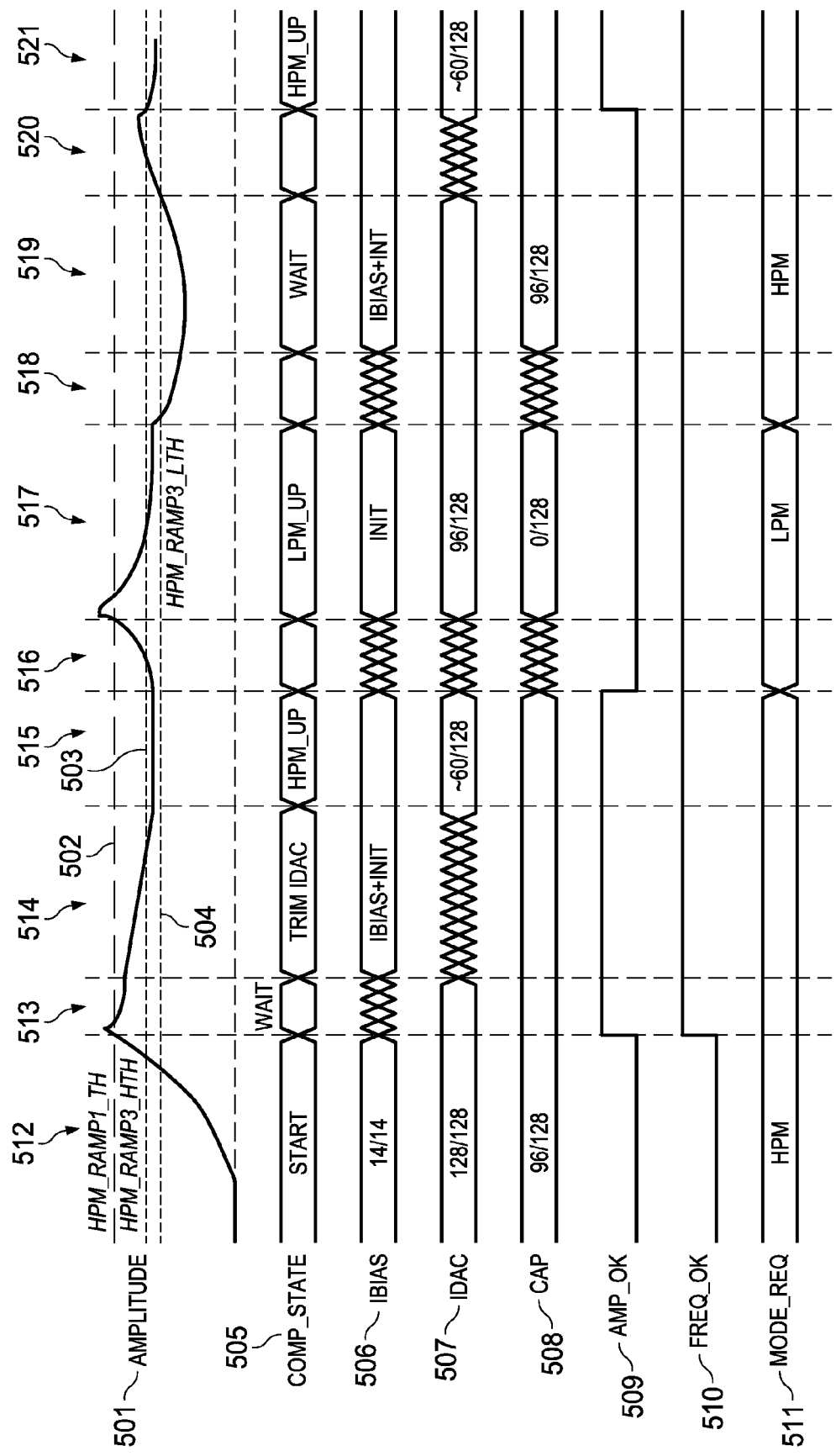

FIG. 5 illustrates sample waveforms showing the transition between power modes.

Figure 6:
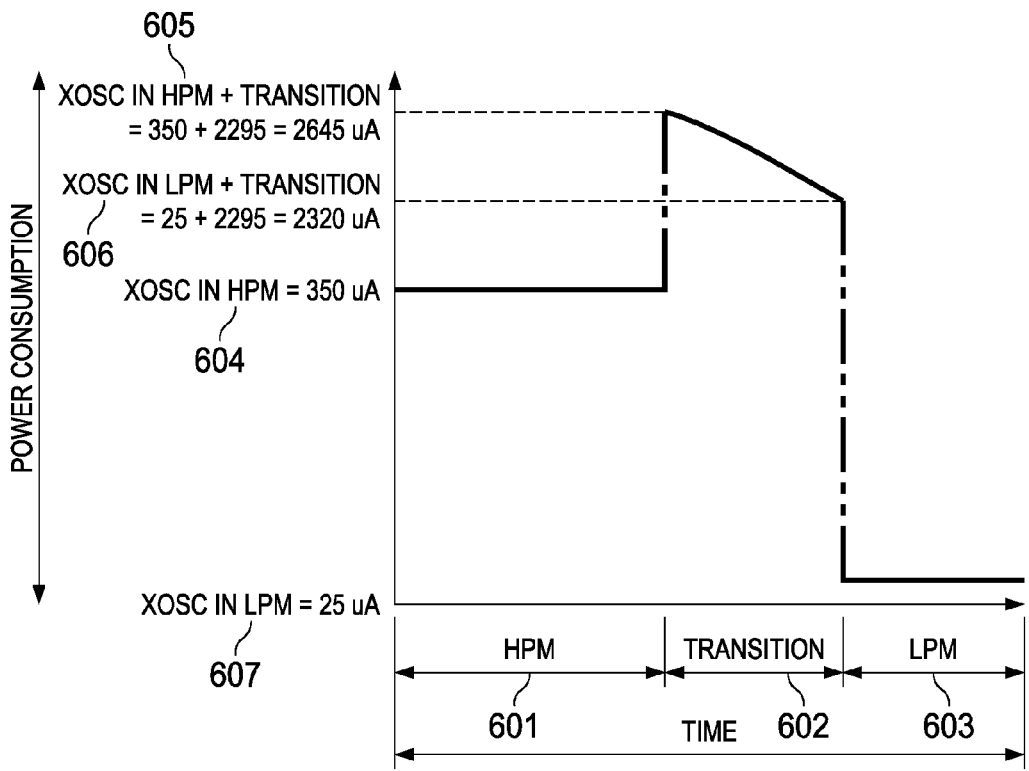

FIG. 6 illustrates power consumption of the oscillator during a transition between power modes for an oscillator having dual clocks.

Figure 7:
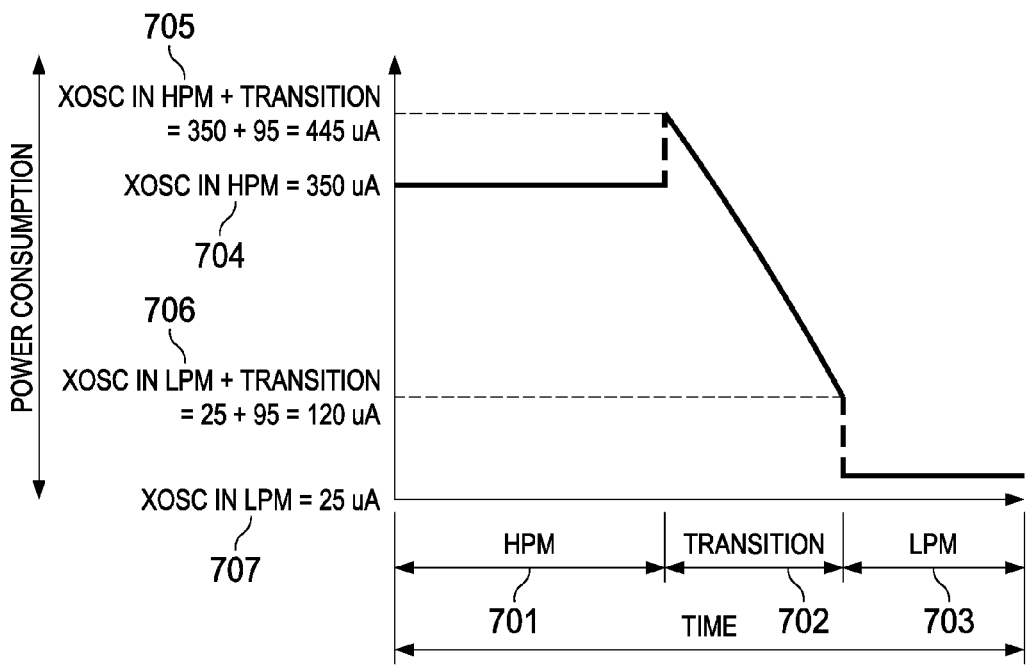

FIG. 7 illustrates power consumption of an oscillator circuit as described herein using the same clock source for both high power mode and low power mode.

Figure 8:
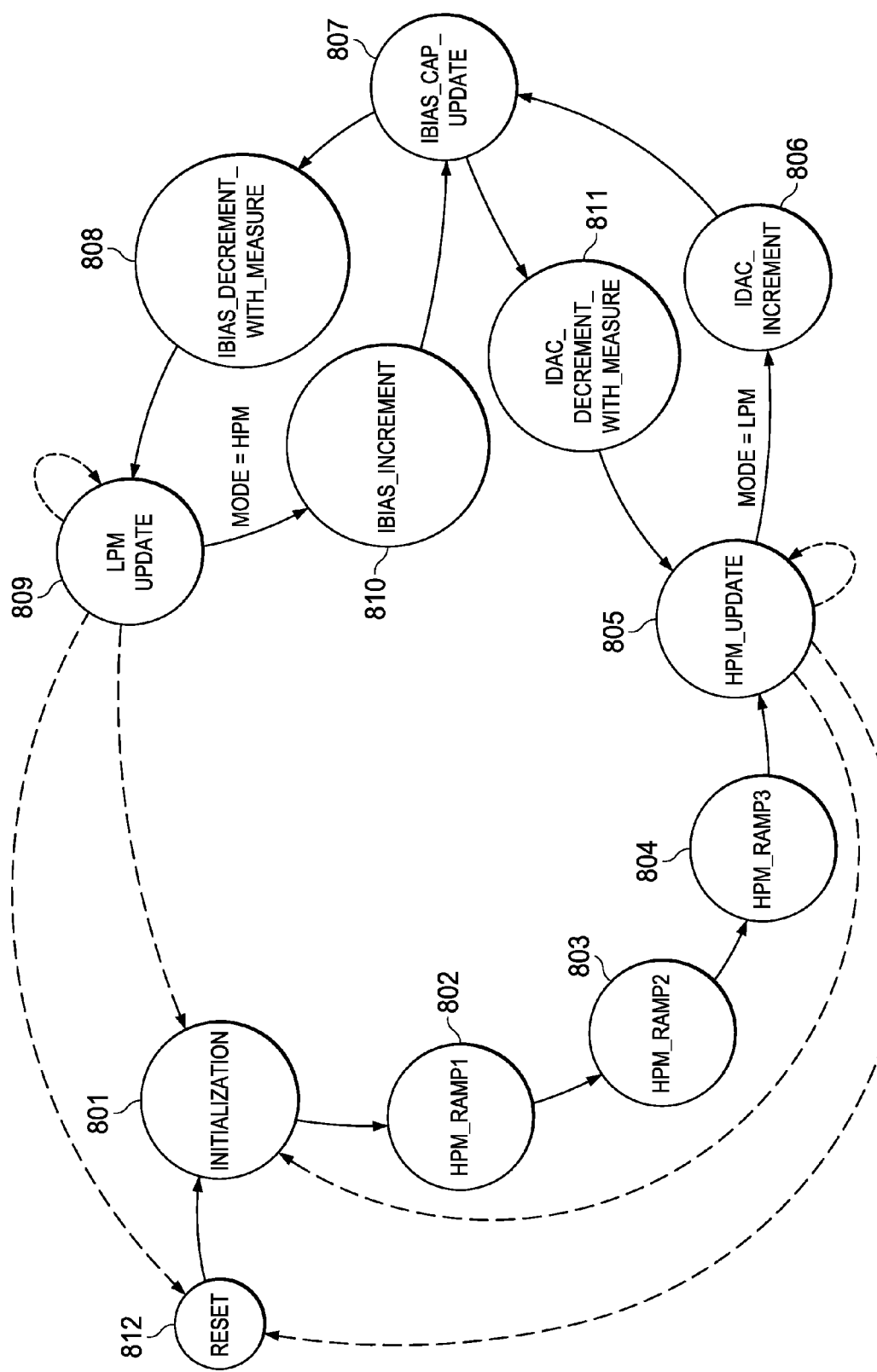

FIG. 8 is a state diagram showing the transition between a high power/high accuracy mode and a low power/low accuracy mode.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is highly simplified block diagram of a wireless communication device 100 that uses a crystal oscillator circuit 101. Device 100 may be used, for example, to exchange communications signals with other devices. Signals are received at antenna 102 and then processed in transmitter/receiver (transceiver) circuit 103, which may, for example, down-convert and demodulate the received signal. Transceiver circuit 103 provides a baseband signal to baseband processing circuit 104, which may decode information carried in the baseband signal. User interface 105 provides the information to the user, such as by playing an audio message on a speaker or displaying data on a text or graphics interface. Similarly, the user may transmit information to other devices. The information, such as speech, text, or data, is entered via user interface 105 and then provided to baseband processing circuit 104. After encoding the information, baseband processing circuit 104 provides a baseband signal to transceiver circuit 103, which modulates and up-converts the signal for transmission via antenna 102.

Transceiver 103 uses a reference signal from crystal oscillator 101 for modulation and demodulation of the signals. The crystal oscillator 101 may operate in a high power mode when device 100 is transmitting or receiving and operate in a low power mode at other times. A controller 106 monitors and controls the components of device 100. Power supply 107, which may be a battery or other portable power source, provides power to device 100. When device 100 transmits, transceiver circuit 103 and crystal oscillator 101 typically operate in a high power mode to generate accurate transmission signals. To preserve energy in power supply 107, controller 106 may limit the time during which transceiver circuit 103 and crystal oscillator 101 operate in this high power mode.

When operating in the low power mode, the crystal oscillator's output frequency is less accurate than the signal generated in the high power mode. Traditionally, crystal oscillators that could operate in both a low power/low accuracy mode and high power/high accuracy mode needed an external clock source to drive the digital control loop during the mode transition.

FIG. 2 is a block diagram illustrating a prior art crystal oscillator circuit 200. Digital amplitude compensator 201 provides control signals to crystal oscillator core 202 and directs the oscillator to operate in either a high power mode or a low power mode. Peak detector 203 senses the output amplitude of the signal from crystal oscillator core 202. Peak detector 203 provides a feedback signal to analog-to-digital converter (ADC) 204, which converts the feedback to a digital input to digital amplitude compensator 201. If, for example, the output signal from crystal oscillator core 202 is too high or low, digital amplitude compensator 201 may adjust the bias current to correct the amplitude of the output.

Circuit 200 requires an extra clock source 205 to transition the oscillator between the low power/low accuracy mode and the high power/high accuracy mode. Digital amplitude compensator 201 uses clock signal 206 from mux 207, which selects either the clock from crystal oscillator core 202 when in high power mode or a clock signal from oscillator 208 during low power mode. When circuit 200 shifts between high power and low power modes, the time base is lost due to this abrupt change in clocks. Also, the use of separate clocks during the transition results in higher power consumption and increased complexity. Circuit 200 also has a less accurate time base after the transition to the low power mode because it uses a clock signal that is uncorrelated to the crystal oscillator 202 to perform the transition. As a result, circuit 200 is not suitable for wireless sensor nodes and other systems that require the transceiver to have an accurate real-time clock at all times.

Crystal oscillators that use digital amplitude and frequency control loops are known and may support multiple power/accuracy modes. However, such circuits require a different clock source for the digital control loop.

The solution described herein derives the clock required for the control loop from the same crystal oscillator that is being controlled. This requires that the oscillator output never have malformed or missing clock pulses. The crystal oscillator should provide consistent clock pulses even when the power consumption is changing, for example, by twenty times and the amplitude is changing by up to five times.

FIG. 3 is a block diagram illustrating crystal oscillator circuit 300 that does not require an extra clock source to transition the oscillator between a low power/low accuracy mode and a high power/high accuracy mode. Digital amplitude compensator 301 provides control signals to crystal oscillator core 302 and directs the oscillator to operate in either a high power mode or a low power mode. Peak detector 303 senses the output amplitude of the signal from crystal oscillator core 302 and provides a feedback signal to ADC 304. Digital amplitude compensator 301 uses clock signal 305 at all times, including during both low power mode and high power mode operations.

FIG. 4 is a schematic of an analog portion 400 of an oscillator indicating the adjustments that may be used to transition between low power and high power modes. Crystal oscillator 401 is loaded with load capacitance 402. In full power mode, crystal oscillator 401 is loaded with a capacitance that matches the value CL specified by the crystal manufacturer. In the example illustrated in FIG. 4, the load capacitance is created with two capacitors, C1 and C2, whose series combination equals CL.

To ensure oscillation, the oscillator negative resistance must be greater than the crystal series resistance. The negative resistance is given by $$-R_{n0} = \frac{g_m}{\omega^2 C_1 C_2} \quad \text{(Eq. 1)}$$

Therefore, the required $g_m$ and power consumption is greatly reduced as the value of C1 and C2 are decreased. As the load capacitance is decreased, the frequency increases according to the well know crystal tuning equation.

$$f_L = f_S \cdot \sqrt{1 + \frac{C_M}{C_O + C_L}} \approx f_S \cdot \left(1 + \frac{C_M}{2(C_O + C_L)}\right) \quad \text{(Eq. 2)}$$

These relationships allow a tradeoff between frequency accuracy and power consumption. In implementation disclosed herein, the oscillator itself generates a clock for use by the control loop, even during the transition between high/low power modes. In one embodiment, this is accomplished by implementing capacitors C1 and C2 as a pre-distorted row-column encoded array. Also, the bias current generation has been implemented with a thermometer encoded resistor string 403, and the bias current mirror 404 may be implemented, for example, using a seven-bit binary-encoded array.

The basic oscillator structure is shown in FIG. 4. The CAP input controls the capacitor value (C1+C2), the IDAC input controls the current mirror 404 ratio, and the IBIAS input controls the bias resistance 403. In this circuit, reducing the capacitor value (C1+C2) and increasing the current mirror 404 ratio will increase the $g_m$ and the oscillator amplitude. Increasing the bias resistor 403 reduces the amplitude of the signal.

When operating in high power mode, an accurate frequency is required. This is accomplished by setting the value of C1 in series with C2 to the $C_L$ value defined by the manufacturer of crystal 401 for the desired operating frequency. In low power mode, an accurate frequency is not required, so frequency accuracy can be traded for power savings. When transitioning from one power mode to another, the starting and ending capacitance values are known. The capacitance is set to $C_L$ at high power to maintain the accurate frequency, but this requires a lot of current from the power supply or battery. The capacitance for the low power mode may be set to 0 or to the circuit's parasitic capacitance. However, the capacitance value cannot be instantaneously changed from the $C_L$ value to 0 pF or from 0 pF to $C_L$ because such a radical change will cause the circuit to lose clock cycles and to lose the time base. Instead, the transition between power modes may be made gradually so that no cycles are lost and the time base is maintained.

This transition may be accomplished in a series of steps that gradually change the capacitance, current mirror ratio, and bias current. Accordingly, in order to transition between the high/low power modes, the controls for the crystal oscillator core are adjusted in an alternating fashion such that the amplitude and frequency of the output clock signal changes smoothly. This results in a stable clock signal that can be used in the oscillator control loop throughout the transition between power modes.

FIG. 5 illustrates sample waveforms showing the transition between power modes. Amplitude trace 501 represents the output amplitude of the crystal oscillator core. Amplitude thresholds may be applied during the transition between states. Additionally, the transition between states may be organized into different states or ramps. For example, a maximum allowed amplitude threshold 502 may be set for a first state, and high and low amplitude thresholds 503, 504 may be set for another state.

A digital amplitude compensator state is shown as waveform 505. Control variables IBIAS 506, IDAC 507, and CPA 508 are shown as individual traces. Amplitude state 509 and frequency state 510 are also represented along with requested mode 511.

Period 512 is a startup period for the crystal oscillator. The digital amplitude compensator state 505 is START and the requested mode 511 is high power mode (HPM). The digital amplitude compensator begins moving the IBIAS 506, IDAC 507, and CAP 508 control signals through a number of steps to smoothly transition the crystal oscillator circuit from low power mode (LPM) to HPM. For example, the values may be adjusted in 128 steps. The oscillator output amplitude 509 and frequency 510 states indicate that the amplitude and frequency have not reached a desired level. During this period, the output amplitude 501 rises to a first threshold level 502.

During period 513, the oscillator amplitude is allowed to settle as bias current adjustments are made. In period 514, the bias current is equal to the initial (INIT) current plus the commanded IBIAS value, and the current mirror is trimmed to stabilize the output amplitude within a desired threshold range 503,504. Once the output amplitude is stabilized within the desired range 503, 504, then additional updates to the control signals may be made in period 515.

In period 516, the low power mode 511 is requested. In period 517, the IBIAS 506, IDAC 507, and CAP 508 control signals are adjusted in a series of steps for the transition to the low power mode. In periods 518-521, the circuit switches back to high power mode.

The digital amplitude compensator may adjust the IBIAS 506, IDAC 507, and CAP 508 control signals in any appropriate order. For example, knowing the starting and ending (e.g. . . . , HPM and LPM) values of the signals (i.e., CAP corresponds to $C_L$ for HPM, and 0 pF or parasitic capacitance for LPM), the digital amplitude compensator may simply divide the LPM-HPM range for each of the variables into 128 steps and adjust each variable one step at a time in order. In other embodiments, each variable may be divided into a different number of steps, and each variable is adjusted in an order determined by the digital amplitude compensator based upon the frequency and amplitude observed at the time. The digital amplitude compensator may memorize or learn the steps required to smoothly adjust the crystal oscillator between power modes without losing clock cycles and preserving the time base. This learning may occur over one transition or a series of transitions and, once learned, the digital amplitude compensator may use the same control steps for power mode transitions for a selected frequency.

FIG. 6 illustrates power consumption of the oscillator during a transition between a high power/high accuracy mode and a low power/low accuracy mode for an oscillator having dual clocks, such as shown in FIG. 2. The graph illustrates the power levels as the oscillator moves from a high power state 601, to transition state 602, to a low power state 603. In the example illustrated, the oscillator initially consumes 350 uA (604) while operating in the high power mode. When the transition to low power mode begins, the oscillator circuit's power demand increases to 2645 uA (605) when the extra clock is activated. The current drops to 2320 uA (606) during the transition. Once the oscillator has stabilized in the low power mode, the current drops to 25 uA (607).

FIG. 7 illustrates power consumption of an oscillator circuit as described herein using the same clock source for both high power mode and low power mode. The oscillator circuit transitions from a high power state 701, to a transition state 702, and then to a low power state 703. The single clock source oscillator circuit starts and ends at the same power consumption 704, 707 in the high power mode and low power mode as the dual clock source circuit. However, the peak power consumption 705 during the transition is much less because there is no second clock source that requires additional current. Also, stepping down the bias current in a controlled manner, the final transition power consumption 706 is lower than the corresponding power demand 606 in the dual clock source circuit.

FIG. 8 is a state diagram showing the transition between a high power/high accuracy mode and a low power/low accuracy mode. The oscillator is initialized at state 801 and then moves through three ramp states 802-804 as the oscillator stabilizes in the high power mode at state 805. Each of these ramp states may correspond to different profiles used by the digital amplitude compensator while controlling the IBIAS, IDAC, and CAP control signals, such as following different amplitude thresholds using different step sizes, etc. The oscillator remains in the high power state 805 until the digital amplitude compensator begins to transition to low power.

The oscillator moves to state 806 to start the transition to low power by incrementing the IDAC input. Then, in state 807, the IBIAS and CAP inputs are updated to in a gradual transition that maintains the time base and does not lose clock cycles. IBIAS is decremented in state 808 until low power mode is reached in state 809. The oscillator will remain in state 809 as long as it is in the low power mode.

If the oscillator is commanded back to the high power mode, then the oscillator moves to state 810 and the IBIAS input is incremented. The IBIAS and CAP are further updated in state 807, and the IDAC is decremented in state 811, until the oscillator finally reaches the high power mode in state 805.

While in the high power state 805 or low power state 809, the oscillator may move to reset state 812 or initialization state 801 instead of transitioning to the other power mode.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. An oscillator circuit, comprising:
a crystal oscillator bias circuit including a variable current mirror circuit; and
a compensator circuit coupled to the crystal oscillator bias circuit, the compensator controlling operation of the crystal oscillator bias circuit in both a high power mode and a low power mode and controlling a ratio of the variable current mirror circuit.

2. The oscillator circuit of claim 1, wherein the crystal oscillator bias circuit further comprises:
a variable capacitance element; and
a variable bias current.

3. The oscillator circuit of claim 2, wherein the compensator circuit controls a value of the variable capacitance element and a value of the variable bias current.

4. The oscillator circuit of claim 3, wherein the value of the variable capacitance element and the value of the variable bias current are selected by the compensator circuit based upon whether the oscillator circuit is operating in a high power mode or a low power mode.

5. The oscillator circuit of claim 3, wherein the value of the variable capacitance element and the value of the variable bias current are varied in a plurality of steps by the compensator circuit to change the oscillator circuit from a high power mode to a low power mode.

6. The oscillator circuit of claim 3, wherein the value of the variable capacitance element and the value of the variable bias current are varied in a plurality of steps by the compensator circuit to change the oscillator circuit from a low power mode to a high power mode.

7. An oscillator circuit, comprising:
a crystal oscillator bias circuit, wherein the crystal oscillator bias circuit further includes:
  a variable capacitance element; and
  a variable bias current; and
a compensator circuit coupled to the crystal oscillator bias circuit, wherein the compensator circuit adjusts both the value of the variable capacitance element and the value of the variable bias current from a first set of values to a second set of values in a plurality of steps in a manner that prevents the loss of clock cycles generated by the oscillator circuit, controls a value of the variable capacitance element and a value of the variable bias current, and controls operation of the crystal oscillator bias circuit in both a high power mode and a low power mode.

8. The oscillator circuit of claim 7, wherein the first set of values corresponds to a first desired power mode and the second set of values corresponds to a second desired power mode.

9. A wireless communication device, comprising:
a transceiver circuit for generating communication signals for transmission to other devices and for processing received communication signals from the other devices; and
an oscillator circuit providing a reference signal to the transceiver circuit during transmission and reception, the oscillator circuit including:
  a crystal oscillator bias circuit including:
    a variable capacitance element;
    a variable bias current;
    a current mirror with a variable ratio; and
  a compensator circuit coupled to the crystal oscillator bias circuit, the compensator controlling operation of the crystal oscillator bias circuit in both a high power mode and a low power mode and during transitions between power modes, and controlling values of the variable capacitance element, the variable bias current, and the variable ratio.

10. The wireless communication device of claim 9, wherein the values of the variable capacitance element, the variable bias current, and the variable ratio are selected by the compensator circuit based upon whether the oscillator circuit is operating in a high power mode or a low power mode or transitioning between power modes.

11. The wireless communication device of claim 10, wherein the compensator circuit adjusts the values from a first set of values to a second set of values in a plurality of steps in a manner that prevents the loss of clock cycles generated by the oscillator circuit.

12. The wireless communication device of claim 11, wherein the first set of values corresponds to a first desired power mode and the second set of values corresponds to a second desired power mode.

13. The wireless communication device of claim 9, wherein the oscillator circuit provides a clock reference signal to the compensator circuit in both a high power mode and a low power mode and during transitions between power modes.

14. A method for controlling an oscillator circuit, comprising:
generating an output signal by a crystal oscillator circuit, wherein the crystal oscillator circuit includes a crystal oscillator bias circuit;
controlling a variable capacitance element of the bias circuit by a compensator circuit;
controlling a variable bias current of the bias circuit by the compensator circuit; and
controlling a variable ratio for a current mirror of the bias circuit by the compensator circuit;
receiving a clock signal from the crystal oscillator circuit at the compensator circuit;
receiving measurements of the output signal as feedback at the compensator circuit;
generating control signals for the crystal oscillator circuit by the compensator circuit based upon the feedback; and
adjusting the crystal oscillator circuit from a first power mode to a second power mode using the control signal while maintain a continuous clock signal to the compensator circuit from the crystal oscillator circuit.

15. The method of claim 14, further comprising:
adjusting values of the variable capacitance element, the variable bias current, and the variable ratio in a series of steps that prevent loss of dock cycles from the crystal oscillator circuit.

* * * * *